(12) United States Patent
Winkler

(10) Patent No.: US 7,410,102 B2
(45) Date of Patent: Aug. 12, 2008

(54) NON-VOLATILE MEMORY CARD WITH AUTARKIC CHRONOMETER

(75) Inventor: Otto Winkler, Hebertsfelden (DE)

(73) Assignee: Infineon Technologies Flash GmbH & Co. KG, Dresden (DE)

( * ) Notice: Subject to any disclaimer, the term of this patent is extended or adjusted under 35 U.S.C. 154(b) by 240 days.

(21) Appl. No.: 11/081,086

(22) Filed: Mar. 15, 2005

(65) Prior Publication Data
US 2006/0208092 A1  Sep. 21, 2006

(51) Int. Cl.
*G06K 19/06* (2006.01)

(52) U.S. Cl. .................... 235/492; 235/380

(58) Field of Classification Search ............... 235/492, 235/380, 487; 711/102, 103; 361/737; 365/208, 365/233
See application file for complete search history.

(56) References Cited

U.S. PATENT DOCUMENTS

| | | | | |
|---|---|---|---|---|
| 5,180,902 A | * | 1/1993 | Schick et al. ............... | 235/380 |
| 6,010,074 A | * | 1/2000 | Kelly et al. ................. | 235/492 |
| 6,644,556 B2 | * | 11/2003 | Adelmann ................. | 235/492 |
| 6,690,556 B2 | | 2/2004 | Smola et al. | |
| 6,764,005 B2 | * | 7/2004 | Cooper ...................... | 235/449 |
| 6,902,115 B2 | * | 6/2005 | Graf et al. ............... | 235/472.01 |
| 6,966,497 B1 | * | 11/2005 | Hohmann et al. .......... | 235/492 |
| 7,048,195 B2 | * | 5/2006 | Berstis ...................... | 235/492 |
| 2001/0020271 A1 | | 9/2001 | Ito | |
| 2006/0129849 A1 | * | 6/2006 | Abgrall et al. ............. | 713/300 |

OTHER PUBLICATIONS

Ishihara, H., "Secure MultiMediaCard for Content Protection and E-Commerce," www.ecnmag.com, Semiconductor Monthly, Dec. 15, 2001, pp. 23 and 26-29.

* cited by examiner

*Primary Examiner*—Ahshik Kim
(74) *Attorney, Agent, or Firm*—Slater & Matsil, L.L.P.

(57) ABSTRACT

A non-volatile memory card is described, which comprises a chronometer powered by an autarkic, card-internal power supply with a long-term energy store. The chronometer is connected to a card internal controller, such that the chronometer can provide the current time to the controller independent of a host system.

31 Claims, 2 Drawing Sheets

NON-VOLATILE MEMORY CARD WITH AUTARKIC CHRONOMETER

TECHNICAL FIELD

The present invention relates generally to a semiconductor device and methods, a more particularly to a non-volatile memory card with autarkic chronometer.

BACKGROUND

Non-volatile memory cards (NVMCs) are becoming more and more popular. They are now widely used in many applications, notably in storage solution for digital consumer devices such as digital cameras or personal audio equipment. In such applications the data stored on the memory card is usually copied to another device like a personal computer or from another medium like an Audio-CD, which serves as a long-term storage facility. Consequently long-term storage of data on non-volatile memory cards has not been an issue yet.

As prices for such memory cards go down, they are also used in other application areas, e.g., for long-term storage of all kinds of data. Although non-volatile memory cards provide a reliable storage solution, even such memory cards degrade with time. For that reason it is necessary to keep track of the age of non-volatile memory cards.

If a memory card reaches a critical age, the memory module's data content needs to be refreshed, e.g., by reading it into the volatile memory of a card controller or a host system and writing it back to the memory module. This procedure activates memory card internal memory management functions, for example bad block detection and exclusion. Alternatively, it is possible to copy the data from the old memory card to a new memory card and to dispose of the old memory card.

With current technology, it is possible to estimate the expected lifetime during the manufacturing process or use of the memory card, e.g., based on statistical data from quality tests like counting the number of defective storage cells. However, it is a disadvantage of the current generation of non-volatile memory cards that it is very hard to enforce the deactivation of a non-volatile memory card at the end of the expected lifetime once it has been released to a customer. Usually constraints concerning the lifetime of a memory card are just printed as a disclaimer or guaranty on the packaging of the card. However, many customers do not read such information or do not act according to them. In addition such disclaimers are typically based on indirect aging parameters like storage cycles or the mean time between failures (MTBF), which bear no direct meaning for a consumer.

One method of overcoming the problem is to specify the number of allowed read and write cycles of the non-volatile memory card. Because every read and write operation is performed by a card internal controller, a counter can be implemented in the controller and can be used to record the number of read and write operations performed on the non-volatile memory module.

Alternatively, the operational lifetime of the non-volatile memory card can be determined by measuring the time the device has been active, i.e., the time the memory card was connected to a host system providing the memory card internal controller with electrical energy.

Unfortunately these methods are not as flexible as measuring the wall clock time directly. An additional disadvantage of these methods is that such observations can only be made and analyzed as long as the non-volatile memory card is connected to a host system. Consequently, such methods are unsuitable for long-term storage solutions based on non-volatile memory cards, such as data archives comprising a multitude of NVMCs, which are only connected to an external, electrical device very infrequently. For such applications the number of read and write cycles or the operational lifetime is very low and not suitable to evaluate the device's lifetime.

SUMMARY OF THE INVENTION

Accordingly, in one aspect the present invention describes a non-volatile memory card, which is capable of determining its own age even in the absence of a host system.

Other applications of non-volatile memory cards require the determination of the age of the memory card as well, which are described in the detailed description of the present invention.

In order to achieve advantages, a memory card is provided, comprising at least one non-volatile memory module, a controller, an interface for exchanging data with an external, electronic device, a power supply with a long-term energy store and a chronometer. The controller is connected to the memory module and the interface, and the chronometer is connected to the power supply and the controller, such that the chronometer is operable independently from an external, electronic device connected to the interface and configured to provide a time signal to the controller.

In one aspect of the present invention, a memory card includes a controller coupled to an electrical interface for connecting an external, electronic device, a chronometer and a power supply comprising a rechargeable battery as a long-term energy store. Because the chronometer is powered by the autarkic power supply of the memory card, the chronometer is also autarkic. As a consequence, the controller does not depend on a time signal delivered by an external host system, but can rely on the time signal provided by the internal chronometer. Whenever the memory card is connected to an external host system, the battery is recharged to ensure the longtime independence of the chronometer.

According to another aspect of the present invention, the data exchange between the memory card and an external, electronic device is performed using a radio transmission system. Also, the energy used for operating the memory card is transmitted via the radio transmission system. Systems comprising a wireless power supply and wireless data exchange are known, for example, from the U.S. Pat. No. 6,690,556, which is incorporated herein by reference.

As a consequence, the non-volatile memory card can be operated and exchange data with the external device, even if the memory card is not physically connected to the external device. The antenna required for data exchange with the external, electronic device can also be used to receive a time signal, which is provided to the internal chronometer by a public transmitter. In such an arrangement, the chronometer can update its internal time according to the publicly available time signal. Even in cases were the memory card internal power supply should fail, the chronometer can update its time, once the power supply is reestablished.

In another aspect of the present invention, the memory card also comprises a signaling means, which is controlled by the controller. In the corresponding embodiment the power supply of the memory card also powers the controller. In such an arrangement not only does the chronometer become autarkic, but also the controller. Consequently, the controller can remain operational even if the memory card is not connected to an external host system. Once a predefined point in time has been reached, for example a predetermined time when it becomes necessary to copy the data from the current non-volatile memory card to a new non-volatile memory card, the controller can activate the signaling means to indicate this need to a person entrusted with the data maintenance. In a large data archive comprising thousands of non-volatile memory cards, such an automatic signaling from the memory card makes it easy to detect memory cards that need replacement or other types of maintenance.

According to yet another aspect of the present invention, the chronometer, the power supply or both can be integrated into the controller to form a tamper resistant module (TRM). Such an arrangement is advantageous for high security applications, where manipulation of the internal chronometer or other data stored in the non-volatile memory card must be prevented. Tamper resistant memory modules are known from an article in ECN, Dec. 15, 2001, Secure MultiMedia Card for Content Protection and E-Commerce (www.ecnmag.com), which is incorporated herein by reference.

The inventive memory card can also be used to provide the current time from the built-in, autarkic chronometer to an external, electronic device connected to the non-volatile memory card. In addition, the inventive memory card can provide a message to the external, electronic device containing the current age of the memory card.

Further aspects and embodiments of the present inventions are described in the patent claims.

BRIEF DESCRIPTION OF THE DRAWINGS

The present invention is described using exemplary, but not limiting embodiments of the invention using the following figures.

DETAILED DESCRIPTION OF ILLUSTRATIVE EMBODIMENTS

The present invention is best described using the different embodiments shown in the figures. These embodiments are exemplary and highlight different aspects of the invention. However, they are by no means limiting, and a person skilled in the art will be able to apply the inventive concept in many other embodiments and applications.

Figure 1:
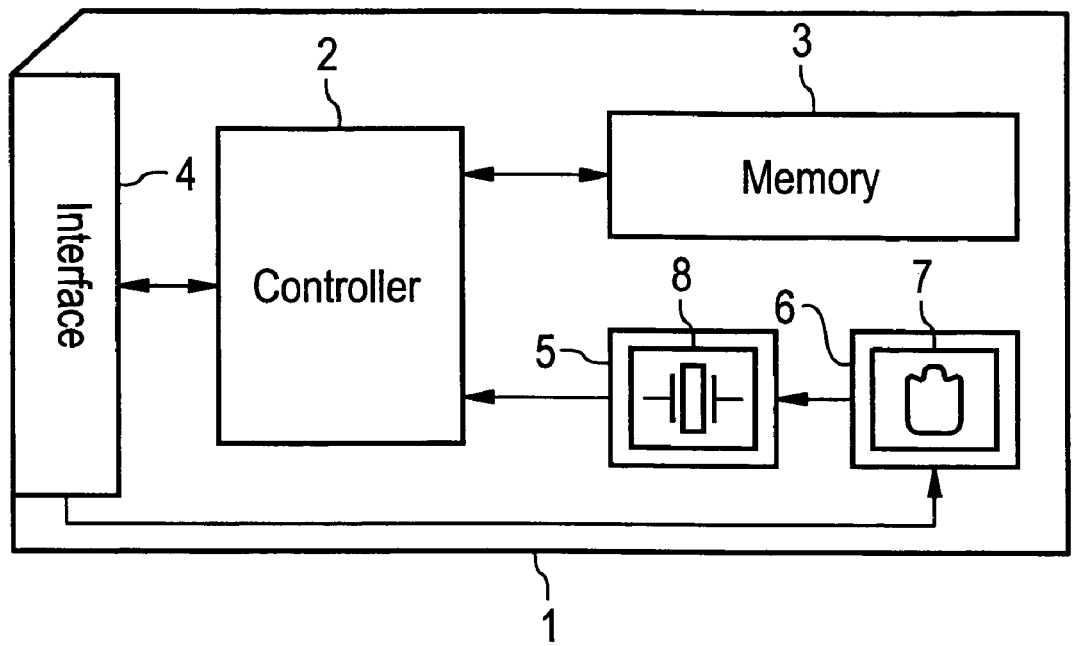
FIG. 1 shows a first embodiment of the present invention, comprising a battery-powered quartz crystal clock.

FIG. 1 shows a first embodiment of the present invention. A memory card 1, for example an xD-Picture Card, a SmartMedia (SM) card or a Memory Stick (MS), comprises a controller 2 and a non-volatile memory module 3. The memory card 1 further comprises an interface 4 for the exchange of data with an external, electronic device such as a host computer (not shown). The controller 2 is connected to the memory module 3 and the interface 4 and controls the data exchange between the memory module 4 and the external, electronic device. The interface 4 is implemented using contacts for forming an electrical connection for transmitting data and power from and to the host system.

The memory card 1 further comprises a chronometer 5 and a power supply 6. The power supply 6 comprises an energy store, in the exemplary embodiment given by a battery 7. In the exemplary embodiment the battery 7 is rechargeable and is connected to the interface 4. The battery 7 has a capacity large enough to supply the chronometer 5 with energy for a period in which the memory card 1 is not connected to an external, electrical device. For example, the battery 7 can have a voltage of 3V and a capacity of 5 or 10 mA hours. The chronometer 5 comprises a crystal quartz element 8, which can be used to generate a clock signal used to drive the chronometer 5. The controller 2 is configured to receive the current time from the chronometer 5.

Because the crystal quartz controlled chronometer 5 requires only very little power, the power supply 6 with the battery 7 can supply the chronometer 5 with electrical energy for a sufficiently long period of time to make the memory card 1 independent from a power supply of the external, electrical device. For example, the electrical energy stored in the battery 7 can be sufficient to operate the chronometer 5 for many months or several years.

In addition, in the described embodiment the battery 7 can be recharged using a voltage provided via the interface 4 while the memory card 1 is connected to the external, electrical device.

As a consequence, such an embodiment is particularly useful in applications requiring long-term storage of non-volatile memory cards 1.

The time stored in the chronometer 5 can be either wall clock time or the time elapsed since either the manufacturing of the memory card 1 or its individualization through a memory card application provider. For example, a company preloading memory cards 1 with information under copyright restrictions could store unique license data on the memory card 1, which expires after a predefined period of time. The chronometer 5 could be configured to send a signal to the controller 2 at the end of this period of time.

Figure 2:
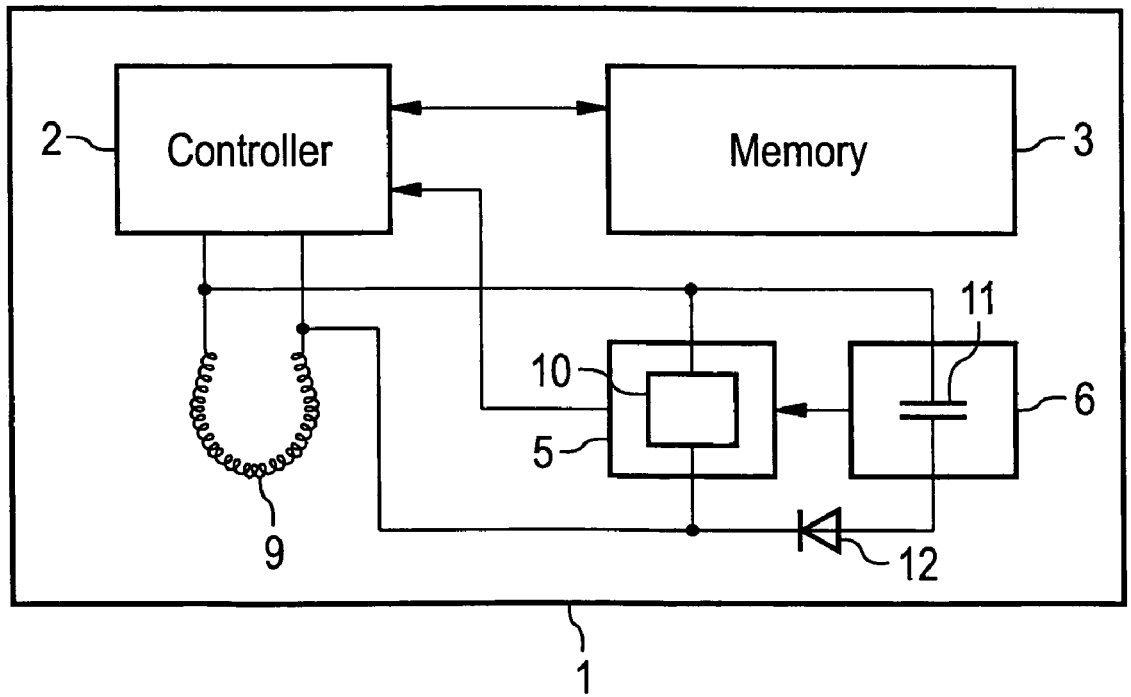
FIG. 2 shows a second embodiment of the present invention, comprising a wireless data and energy transmission system and a time-receiving module.

FIG. 2 shows a second embodiment of the present invention. The exemplary embodiment shows a memory card 1, for example a radio frequency identity (RFID) card, comprising a controller 2 and a non-volatile memory module 3. As in the last embodiment, the memory card 1 comprises a power supply 6 and a chronometer 5. Unlike the last embodiment, the memory card 1 does not provide an electrical interface to directly connect the memory card 1 to an external, electrical device. Instead, the memory card 1 comprises an antenna 9, which serves as the interface and allows to couple the memory card 1 wirelessly to an external, electrical device.

In addition, the chronometer 5 contains a time receiving module 10, which is connected to the antenna 9 and configured to receive the current time from a publicly available time signal. An example of such a publicly available time signal is the long wave radio signal emitted by the DCF 77 radio transmitter, which provides the current date and time in the Middle European area. Another example of a publicly available time signal is radio station WWVB emitted by the National Institute of Standards & Technology (NIST) located in Fort Collins, Colo. in the United States. The power supply 6 contains a capacitor 11. For example, a capacitor 11 with a capacity of 1 µF or 10 µF might be used. In the exemplary embodiment, the capacitor 11 is connected to the antenna 9 over a rectifying means, in the given examples a diode 12.

The capacitor 11 can only store relatively little energy to supply the chronometer 5 with an operating current. For example, the energy stored in the capacitor 11 can be used to supply the chronometer for a few hours or days. However, the capacitor 11 is recharged whenever the memory card 1 is brought into an electrical field. The electrical field induces a voltage in the antenna 9, which is rectified by the diode 12 and used to recharge the capacitor 11. In this way it is possible to provide the chronometer 5 with energy, even if the memory card 1 is not connected to a host system.

As a consequence the memory card 1 can be used in applications where it is relatively frequently brought into an electrical field. Examples of such applications are contactless access control systems based on RFID cards. In such an application the memory card 1 is used to identify the holder of the memory card 1 to access an area or device controlled by a controller, which is configured to exchange information with the memory card 1 by the means of radio frequency communication.

Even if the power supply 6 should fail, because the memory card 1 cannot receive sufficient amount of energy from an ambient electrical field and the capacitor 11 is fully discharged, the described embodiment can still provide a current time signal to the controller 2 at the time of the next access to the memory card 1. Before such an operation can take place, the memory card 1 must be brought into an electrical field of, e.g., a host system, which can be used to power the controller 2 and the time receiving module 10. In this situation the controller 2 must enforce that a current time signal is received by the time receiving module 10 before any access to the non-volatile memory module 3 is granted.

In the embodiment shown in FIG. 2 the single antenna 9 is connected to the controller 2 to enable the data exchange with an external, electrical device. The antenna 9 is also connected with the power supply 6 to allow the recharging of the capacitor 11, and it is further connected to the chronometer 5 to allow the reception of the publicly available time signal by the time receiving module 10. In practice, however, two or more different antennas 9, tuned to the individual frequencies of the three different uses of the antenna 9 might be used. For example a coil and a dipolar antenna might be used.

Figure 3:
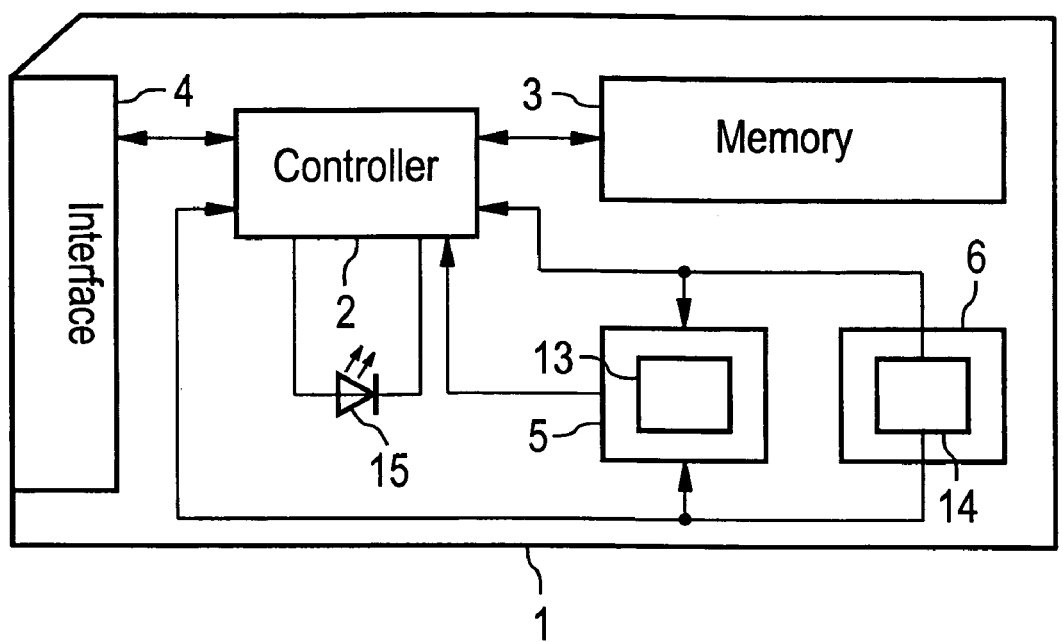
FIG. 3 shows a third embodiment of the present invention, comprising a solar cell and a card-internal signaling means.

FIG. 3 shows a third embodiment of the present invention. A memory card 1, for example a USB Flash drive or a Compact Flash (CF) card, comprises a controller 2, a non-volatile memory module 3, an interface 4 for connecting the memory card 1 to an external, electrical device, a chronometer 5 and a power supply 6. The chronometer 5 comprises a decay time measurement unit 13, which is capable of estimating the time based on an observed decay process of a chemical compound or element, for example a radioactive substance. The power supply 6 comprises a solar cell 14 and a rechargeable battery 7 (not shown). The memory card 1 further comprises a signaling element 15, in the example of the present embodiment a light emitting diode (LED), connected to the controller 2. The power supply 6 provides the chronometer 5 and the controller 2 with electrical energy.

Because in this exemplary embodiment the controller 2 is powered by the power supply 6, the controller 2 can operate independently from an external, electrical device connected to interface 4 of the memory card 1.

For example, if the controller 2 receives a time signal from the chronometer 5, which indicates that the controller 2 needs to validate the content of the non-volatile memory module 3, the controller can light up the LED 15, in order to indicate this need. The memory card 1 can then be connected to an external, electrical device using the interface 4, so that more power is available to the controller 2 and also to the non-volatile memory module 3 to execute the required operations for data maintenance.

In an alternative embodiment, in which the power source 6 provides sufficient energy to execute the required steps for memory management, the controller 2 can execute these steps even without being connected to an external electrical device.

For example, the controller 2 could read in random blocks of data from the memory module 3. Using methods for automatic error detection, e.g., by using checksums or parity bits, the controller 2 could calculate the mean bit error rate. If the calculated bit error rate exceeds an acceptable, predefined value, the controller 2 can use the signaling element 15 to indicate this failure, e.g. by repeatedly switching an LED 15 on and off. This allows to easily identify a memory card 1 needing maintenance requiring user interaction to prevent data losses. For example, the memory card 1 could indicate the need to copy its content to a new memory card 1.

Depending on the specific application, other signaling means 15 can be used in alternative embodiments of the present invention. For example a piezo crystal configured to sound an audible alarm at a predefined point in time could be used, or a display, e.g., a liquid crystal display (LCD), displaying a predefined message.

Other operations can be executed by the inventive memory card 1 without a signaling element 15. For example, information stored in the memory module 3, which is protected under copyright and associated with an electronic license also stored in the memory module 3, could be deleted at the end of the license agreement. The controller 2 can read the license information stored in the memory module 3 either at predefined intervals of time, e.g., once a day or once a year, or at the time of an attempted access and compare the license data and in particular its expiry date with the current date received from the chronometer 5. If the current day exceeds the license expiry date, the copyrighted data stored in the memory module 3, which is associated with the expired license, is deleted by the controller 2.

Alternatively, the access to parts or all of the memory module 3 from a host system through the interface 4 can be prevented by the controller 2. Because all read or write requests to the memory module 3 must be executed through the controller 2, the controller 2 can execute a time check before responding to such a request. For example, a promotional memory card 1, or a memory card carrying otherwise licensed materials, can be sold with the condition that write access to the memory card 1 is only allowed for the period of one month. This constraint can be enforced by the inventive memory card 1, if the controller 2 stores the time when the first request is received via the interface 4. To this end, for example, the controller 2 requests the current time from the chronometer 5 and stores it in the memory module 3. At every subsequent write request from the interface 4 the controller 2 reads in the stored time from the memory module 3 and compares it with the current time received from the chronometer 5. If the difference between the two times is greater than one month, the write request is not served by the controller or returned with an error.

In a variation all access to the memory module 3, i.e., write and read requests, can be checked and prevented, if the predefined usage time for the memory card 1 has expired.

In another variation the controller 2 can send a predefined message back to the host system via interface 4, for example an error code or a message to be displayed by the host system, which asks the user to buy a standard product without the limitations of the promotional memory card 1.

In yet another variation the controller 2 can be configured to receive a code to extend the time allowed for read or write access. For example, a user could be requested to call a manufacturer hotline and pay for the continued use of the inventive memory card 1, identified for example by a serial number. The manufacturer could then generate a code unique for the user's memory card 1, which is typed in by the user to a host system and sent via the interface 4 to the controller 2. If the controller 2 accepts the code, e.g., by comparing it with another code stored in the memory module 3 by the manufacturer, the controller 2 could unblock read or write access or both to the memory module 3.

Figure 4:
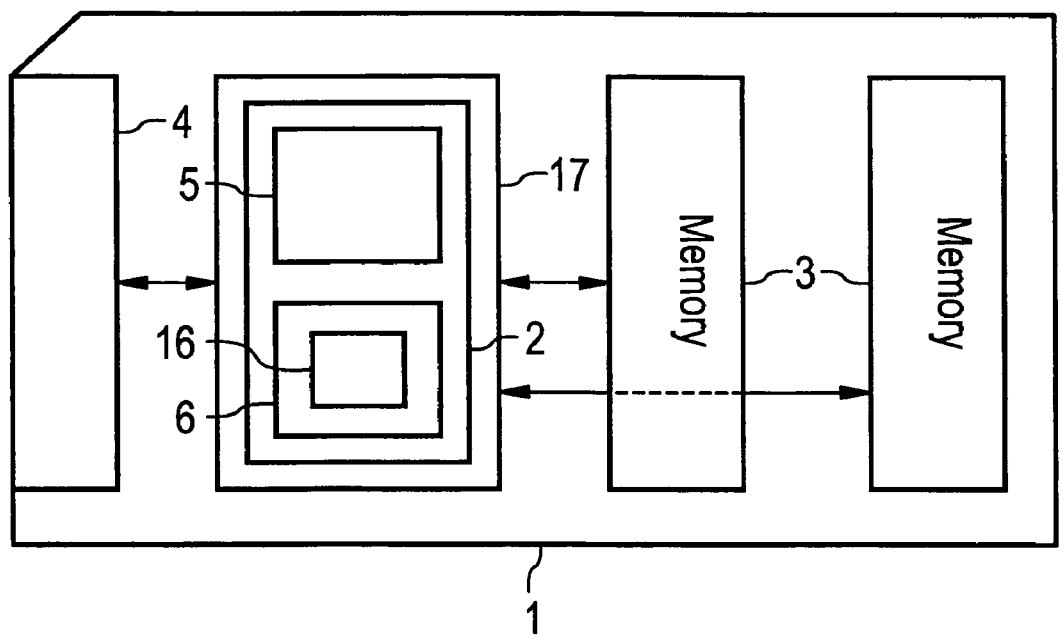
FIG. 4 shows a fourth embodiment of the present invention, comprising a tamper resistant module with an internal fuel cell.

FIG. 4 shows a fourth embodiment of the present invention. A memory card 1, for example a MultiMedia Card (MMC), a Secure Digital (SD) or Mini Secure Digital card, comprises two non-volatile memory modules 3 and a tamper resistant module 17. It further comprises an interface 4 for connecting the memory card to an external, electrical device. The tamper resistant module 17 comprises a controller 2, which further comprises a chronometer 5 and a power supply 6. The power supply 6 comprises a fuel cell 16, which is used to power the chronometer 5 and the controller 2 contained in the tamper resistant module 17.

The tamper resistant module 17 is configured to prevent a tampering with the module's content. For example, the tamper resistant module 17 might be included in a microchip underneath a conductive layer, whose capacity and charge are constantly controlled by the controller 2. If a change in the capacity or charge of the covering conductive layer is observed by the controller 2, caused for example by someone trying to force open the microchip, the non-volatile memory modules 3 can be deleted by the controller 2 as to protect their content from unauthorized access. Similarly the impedance or voltage level of the individual lines connecting the non-volatile memory modules 3 with the controller 2 could be observed, and the non-volatile memory modules 3 could be deleted in case any tampering on the signal lines is observed.

The time signal issued from the chronometer 5 contained in a tamper resistant module 17 and made autarkic by the power supply 6 can also be used by an external, electronic device connected to the interface 4. It can provide a higher accuracy or reliability than the clock signal internal to the external, electrical device itself.

In general, the chronometer 5 or signaling element 15 can be placed internally in the controller or memory module as shown in FIG. 4 or external to them. For example, a simple clock circuit can be implemented as a printed circuit board directly on a board carrying the memory module 3 and the controller 2.

Of course the inventive concept is not restricted to a memory card 1 with a single or two memory modules 3, but can be applied to memory cards 1 with an arbitrary number of memory modules 3.

An example of an application of the invention is the distribution of early production samples, sometimes called "golden device," from a manufacturer to original equipment manufacturers (OEMs) or distributors, which allows an OEM or distributor to test a new product during development. It is desirable for the manufacturer of the sample device to limit the device's lifetime to a short period, for example a few weeks or month to prevent the OEM or distributor from using outdated prototypes. For example a device could stop to operate or send a standard message back to a host system, if it is plugged into the host system after the predefined guarantee or test period.

The deactivation of prototype NVMCs also prevents the spread of such insufficiently tested devices into the general consumer market as they would become unusable after a short, predefined period of time.

As another use case, a manufacturer could sell cheap promotional non-volatile memory cards with built-in timers for testing purposes to consumers. The NVMCs remain fully active for a predefined period of time, e.g., 30 days from purchase, and then switch into a read-only mode in order to encourage the consumer to buy a standard NVMC device without such limitations.

What is claimed is:

1. A memory card comprising:
   at least one non-volatile memory module;
   an interface operable to exchange data with an external, electronic device;
   a controller coupled to said memory module and said interface, such that said controller is operable independently without any request from an external electronic device coupled to said interface;
   a power supply with a long-term energy store, coupled to said controller;
   a chronometer coupled to said power supply and said controller, the chronometer comprising a circuit for receiving and decoding a time signal transmitted via a radio signal, such that said chronometer is operable to continuously provide the time signal to the controller, wherein said controller is operable to receive said time signal at predefined intervals of time independently of any external electronic device and to perform an action within the memory card if the determined current time or elapsed time is equal to or later than a predefined point in time.

2. A memory card according to claim 1, wherein said power supply comprises a battery cell.

3. A memory card according to claim 2, wherein said battery cell is rechargeable and said power supply is configured to charge said battery cell when the memory card is attached to an external, electronic device.

4. A memory card according to claim 1, wherein said power supply comprises a fuel cell.

5. A memory card according to claim 1, wherein said power supply is configured to acquire electrical energy from an ambient electric or magnetic field using an antenna.

6. The memory card according to claim 5, wherein the power supply comprises a capacitor connected to the antenna over a diode.

7. A memory card according to claim 1, wherein said chronometer comprises a quartz crystal for generating a clock pulse.

8. A memory card according to claim 1, wherein said chronometer measures a duration of time since production or individualization of the memory card.

9. A memory card according to claim 1, wherein said controller is configured to prevent execution of predefined operations after a predefined point in time.

10. A memory card according to claim 9, wherein said controller is configured to prevent execution of write operations after said predefined point in time.

11. A memory card according to claim 9, wherein said controller is configured to prevent execution of read operations after said predefined point in time.

12. A memory card according to claim 1, wherein said controller is configured to send a predefined message to an external, electronic device coupled to said interface.

13. A memory card according to claim 1, wherein said controller is configured to execute predefined operations for memory management and error checking at the predefined point in time.

14. A memory card according to claim 1, further comprising a signaling circuit, wherein said controller is configured to activate said signaling circuit at the predefined point in time.

15. A memory card according to claim 1, wherein said controller is configured to provide a current time signal received from said chronometer to a external, electronic device connected to said interface.

16. A memory card according to claim 1, wherein said chronometer and said controller are formed on a single integrated circuit chip.

17. A memory card according to claim 1, wherein said chronometer is internal to said memory module.

18. A memory card according to claim 1, wherein said controller, memory module, power supply or chronometer is comprised in a tamper resistant module to protect the controller, memory module, power supply or chronometer from manipulation.

19. A memory card according to claim 1, wherein the memory card is configured to comply with at least one of the following specifications: Secure Digital (SD), Mini Secure Digital, Multimedia Card (MMC), xD-Picture Card, Memory Stick (MS), SmartMedia (SM), Compact Flash (CF) card, USB Flash.

20. The memory card of claim 1, wherein said provided time signal is representative of one of current time and elapsed time.

21. A method for activating an indicator of a memory card at a predefined point in time, the method comprising:
providing a memory card that includes an internal controller and internal chronometer;
using the internal chronometer to generate a current time by receiving and decoding a time signal transmitted via a radio wave;
repeatedly comparing the current time determined by the chronometer with a predefined point in time stored in the controller without any further communication with an external, electronic device; and
performing an action within the memory card without any further communication with an external, electronic device if the determined current time is equal to or later than the predefined point in time.

22. The method of claim 21, further comprising:
coupling said memory card with an electronic host system;
receiving a request for accessing memory on the memory card, the request received from the host system;
repeatedly determining the current time within the memory card;
comparing the determined current time with the predefined point in time at which the memory card is to be deactivated; and
rejecting the received request if the determined current time is later than the predefined point in time.

23. The method according to claim 22, wherein the request for accessing the memory comprises a write request to overwrite at least parts of the memory.

24. The method according to claim 22, wherein rejecting the received request comprises transmitting a message from the memory card to the electronic host system.

25. The method according to claim 21, wherein performing an action comprises activating a signaling circuit.

26. The method according to claim 25, wherein activating a signaling circuit causes the signaling circuit to indicate that information stored on the memory card should be transferred to a different storage device.

27. The method according to claim 25, wherein performing an action comprises activating a light emitting diode.

28. The method according to claim 21, wherein performing an action comprises exercising memory management operations.

29. A tamper proof memory card comprising:
at least one non-volatile memory module;
an interface operable to exchange data with an external electronic device;
a controller coupled to said memory module and said interface, such that said controller is operable independently without any request from an external electronic device coupled to said interface;
a power supply with a long-term energy store, coupled to said controller; and
a chronometer coupled to said power supply and said controller, such that said chronometer comprises a chemical compound and a monitor to continuously provide a time signal by monitoring a decay process of the chemical compound;
wherein said controller is operable to receive said time signal at predefined intervals of time independently of any external electronic device and to perform an action within the memory card if the determined current time or elapsed time is equal to or later than a predefined point in time.

30. The tamper proof memory card of claim 29, wherein the power supply comprises a solar cell and a rechargeable battery.

31. The tamper proof memory card of claim 29, wherein the chemical compound comprises a radioactive substance.

* * * * *